US011115062B2

(12) United States Patent
Kumar et al.

(10) Patent No.: US 11,115,062 B2
(45) Date of Patent: Sep. 7, 2021

(54) MEMORY SYSTEM WITH ADAPTIVE THRESHOLD DECODING AND METHOD OF OPERATING SUCH MEMORY SYSTEM

(71) Applicant: SK hynix Inc., Gyeonggi-do (KR)

(72) Inventors: Naveen Kumar, San Jose, CA (US); Aman Bhatia, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/355,247

(22) Filed: Mar. 15, 2019

(65) Prior Publication Data

US 2019/0288712 A1    Sep. 19, 2019

Related U.S. Application Data

(60) Provisional application No. 62/643,948, filed on Mar. 16, 2018.

(51) Int. Cl.
*H03M 13/00* (2006.01)
*H03M 13/37* (2006.01)
(Continued)

(52) U.S. Cl.
CPC ...... *H03M 13/3707* (2013.01); *G06F 3/0604* (2013.01); *G06F 3/0659* (2013.01); *G06F 3/0679* (2013.01); *G06F 11/1068* (2013.01); *G11C 29/52* (2013.01); *H03M 13/3746* (2013.01); *G11C 16/0483* (2013.01); *G11C 16/08* (2013.01)

(58) Field of Classification Search
CPC ......... H03M 13/3707; H03M 13/3746; H03M 13/1108; G11C 29/52; G11C 16/0483; G11C 16/08; G11C 29/022; G11C 29/028; G11C 29/023; G06F 9/3016; G06F 13/1668; G06F 11/1068; G06F 3/0679; G06F 3/0659; G06F 3/0604; G06F 11/1048
USPC ........................ 714/752, 758, 763, 764, 774
See application file for complete search history.

(56) References Cited

U.S. PATENT DOCUMENTS 9,614,547 B2    4/2017 Fainzilber et al.
9,812,193 B2    11/2017 Tsang et al.
(Continued)

FOREIGN PATENT DOCUMENTS

KR    10-2015-0053705    5/2015

*Primary Examiner* — Albert Decady
*Assistant Examiner* — Osman M Alshack
(74) *Attorney, Agent, or Firm* — IP & T Group LLP (57) ABSTRACT

Memory controllers, decoders and methods perform decoding of a codeword comprising multiple bits. For a select one of those bits, which belongs to at least one component codeword of the codeword, at an iteration of decoding, the following operations are performed. Channel information for the select bit is biased based on degree of the select bit. A reliability indicator of an initial decision as to whether to flip the select bit is computed based on the initial decision and the biased channel information. The reliability indicator is compared with an adaptive threshold, which is determined based on the degree of the select bit and unsatisfied check (USC) information from the initial decision. A decision is then made as to whether to flip the select bit. The decision and syndromes of each component codeword to which the select bit belongs are updated based on the compare operation.

20 Claims, 6 Drawing Sheets

(51) Int. Cl.
   *G06F 3/06*   (2006.01)
   *G11C 29/52*  (2006.01)
   *G06F 11/10*  (2006.01)
   *G11C 16/08*      (2006.01)
   *G11C 16/04*      (2006.01)

(56) References Cited

U.S. PATENT DOCUMENTS

| | | | |
|---|---|---|---|
| 10,447,301 B2 * | 10/2019 | Hanham | G06F 3/0619 |
| 2010/0042890 A1 * | 2/2010 | Gunnam | H03M 13/3753 |
| | | | 714/752 |
| 2014/0068393 A1 * | 3/2014 | Varnica | H03M 13/255 |
| | | | 714/786 |
| 2014/0164865 A1 * | 6/2014 | Sharon | H03M 13/3715 |
| | | | 714/752 |
| 2015/0169401 A1 * | 6/2015 | Tseng | G06F 11/1068 |
| | | | 714/773 |
| 2015/0188570 A1 * | 7/2015 | Kwok | G06F 11/1076 |
| | | | 714/764 |
| 2015/0381206 A1 * | 12/2015 | Fainzilber | H03M 13/1108 |
| | | | 714/758 |
| 2016/0179620 A1 * | 6/2016 | Bazarsky | H03M 13/3707 |
| | | | 714/766 |
| 2016/0197624 A1 * | 7/2016 | Wang | H03M 13/1108 |
| | | | 714/785 |
| 2017/0206130 A1 * | 7/2017 | Hsiao | H03M 13/6325 |
| 2017/0272097 A1 * | 9/2017 | Weng | H03M 13/1111 |
| 2018/0034477 A1 * | 2/2018 | Zamir | H03M 13/1108 |
| 2019/0068219 A1 | 2/2019 | Bhatia et al. | |

* cited by examiner

```
 1: // Initialize decision-bits
 2: x̄ ← ȳ
 3: // Initialize syndrome to 0
 4: for all j ∈ [m] do
 5:     s̄_j ← 0
 6: // Update syndrome based on initial decisions
 7: for all k ∈ [n] do
 8:     for all j ∈ [m] do
 9:         s̄_j ← s̄_j ⊕ x_k · S[k]
10: // Perform up to ℓ_max iterations
11: fot all ℓ ∈ [ℓ_max] do
12:     for all k ∈ [n] do
13:         // Update USC information
14:         USC=0
15:         for all j ∈ [m] do
16:             USC ← USC + 1 {s̄_j ≠ 0}
17:         // Compute reliaility of k-th code-bit
18:         i_k ← (x_k ⊕ y_k)
19:             +α(d_k) ∏_{j∈M[k]}(1{k∈L_j[s̄_j]})
20:         // Compare with threshold
21:         if i_k > θ(d_k, USC) then
22:             // Update decision and syndromes
23:             x_k ← x_k ⊕ 1
24:             for all j ∈ M[k] do
25:                 s̄_j ← s̄_j ⊕ S_j [k]
26:     if s̄_j = 0 ∀ j ∈[m] then
27:         // Decoding successful
28:         return x̄
```

MEMORY SYSTEM WITH ADAPTIVE THRESHOLD DECODING AND METHOD OF OPERATING SUCH MEMORY SYSTEM

CROSS-REFERENCE TO RELATED APPLICATION

This application claims the benefit of U.S. Provisional Application No. 62/643,948, filed on Mar. 16, 2018, the entire content of which is incorporated herein by reference.

BACKGROUND

1. Field

Embodiments of the present disclosure relate to a memory system and components thereof capable of executing a decoding scheme with adaptive thresholding, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data.

As an evolution of LDPC codes, Generalized LDPC (GLDCP) codes were introduced. GLDPC codes consist of many interleaved codewords of short lengths. These short codewords, referred to as component codewords, are typically Hamming or Bose-Chaudhuri-Hocquenghem (BCH) codewords which can be decoded using their syndromes.

Complex decoding algorithms known in literature provide significant error-correction capability for GLDPC codes. However, since most NAND reads have few errors that need to be corrected, there is a need for a low-complexity decoder for these GLDPC codes.

In this context embodiments of the present invention arise.

SUMMARY

Aspects of the present invention include memory controllers and decoders. In one aspect, a memory controller comprises a decoder, which is configured to perform decoding of a codeword comprising multiple bits. For a select one of those bits, which belongs to at least one component codeword of the codeword, at an iteration of decoding, the decoder is configured to perform the following operations: bias channel information for the select bit based on degree of the select bit; compute a reliability indicator of an initial decision as to whether to flip the select bit based on the initial decision and the biased channel information; compare the reliability indicator with an adaptive threshold, which is determined based on the degree of the select bit and unsatisfied check (USC) information from the initial decision; decide whether to flip the select bit; and update the decision and syndromes of each component codeword to which the select bit belongs based on the compare operation.

The decoder is preferably a bit-flipping (BF) decoder.

Further aspects of the present invention include methods of decoding, which may be performed by memory controllers and components thereof, such as decoders, particularly BF decoders. In this regard, another aspect of the present invention, entails a method of decoding a codeword comprising multiple bits.

For a select one of those bits, which belongs to at least one component codeword of the codeword, such a method comprises the following operations or steps. Biasing channel information for the select bit based on degree of the select bit; computing a reliability indicator of an initial decision as to whether to flip the select bit based on the initial decision and the biased channel information; comparing the reliability indicator with an adaptive threshold, which is determined based on the degree of the select bit and unsatisfied check (USC) information from the initial decision; deciding whether to flip the select bit; and updating the initial decision and syndromes of each component codeword to which the select bit belongs based on the comparing operation.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
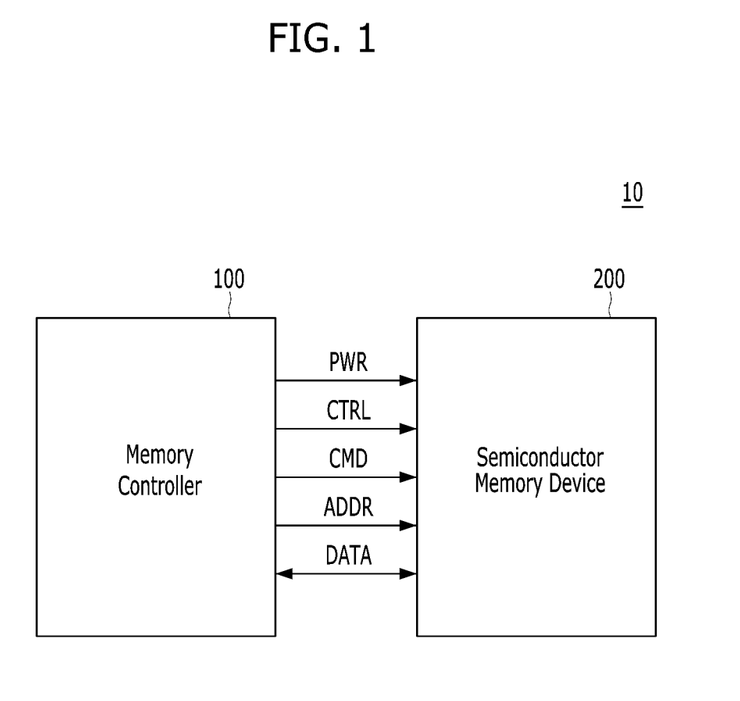
FIG. 1 is a block diagram illustrating a memory system in accordance with an embodiment of the present invention.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAN D-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
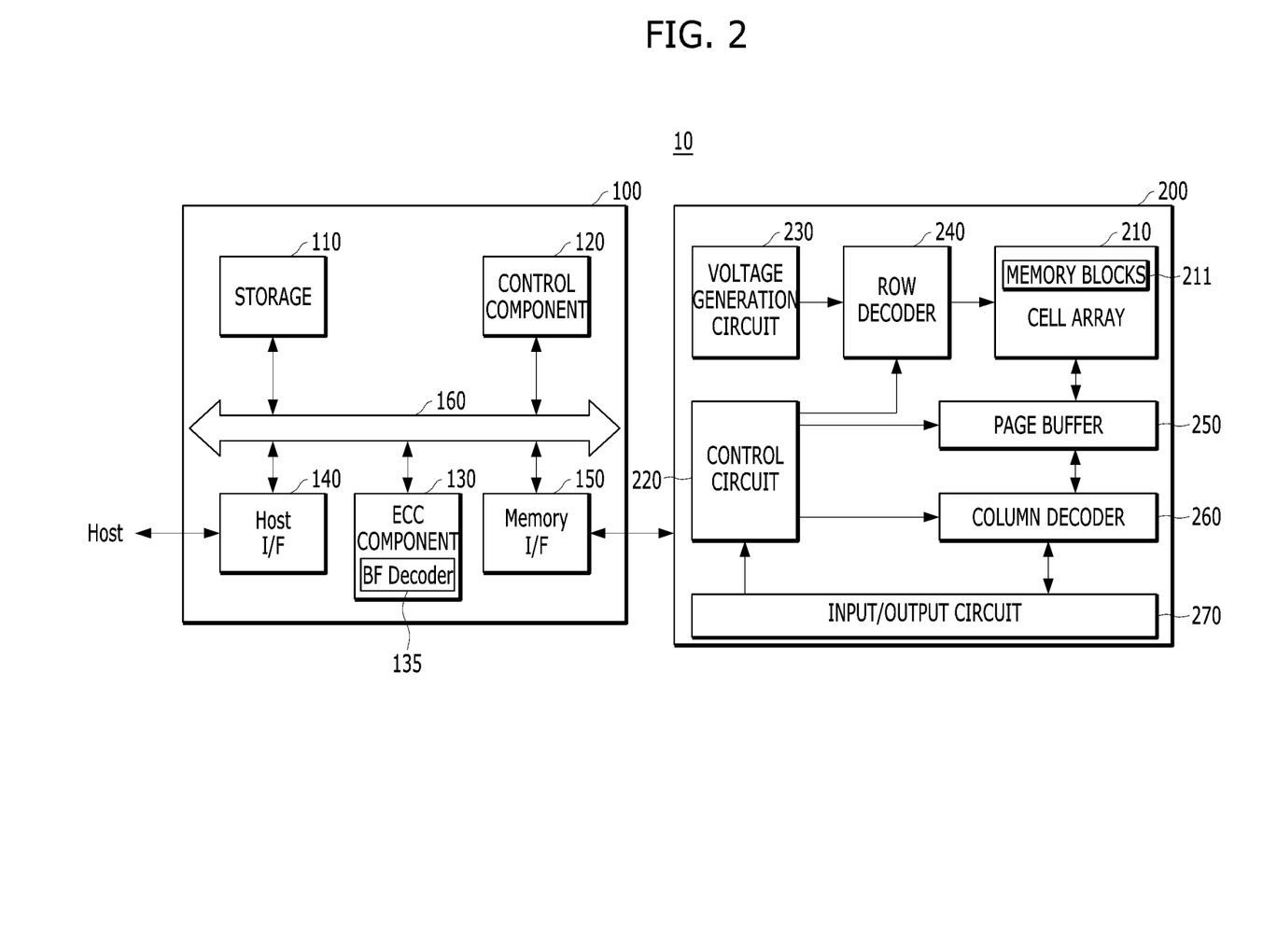
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a block coded modulation (BCM), or Generalized LDPC (GLDPC) code, the latter of which has particular relevance to the present invention. The ECC component 130 may include any and all circuits, systems or devices, e.g., an encoder and a decoder, for suitable error correction operation in accordance with embodiments of the present invention.

The present invention is particularly applicable to decoding GLDPC codes using a bit-flipping (BF) decoder. To that end, in embodiments of the present invention, the ECC component 130 includes a decoder 135, e.g., a BF decoder. As explained in more detail below, the ECC component 130 including the BF decoder 135 are configured to decode GLDPC codes using adaptive thresholding.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer (array) 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
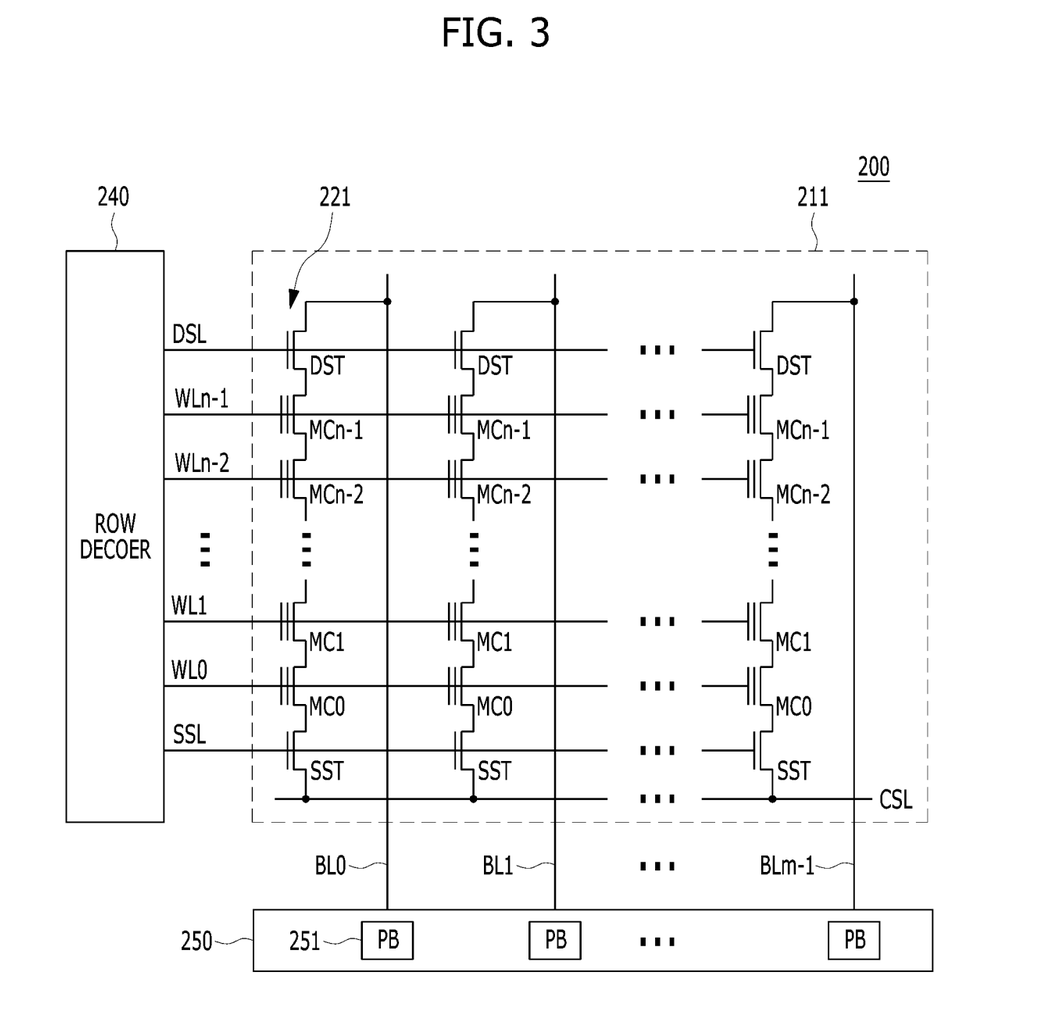
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

Figure 4:
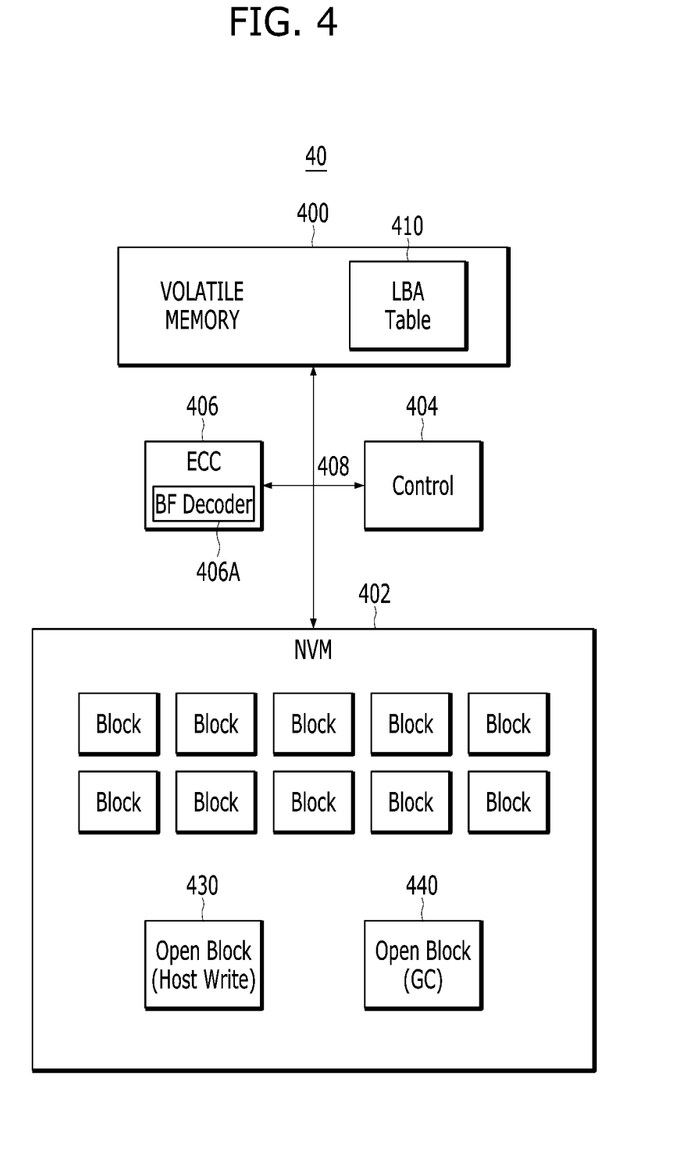
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks, as well as an open block for host writes 430 and an open block for garbage collection (GC) 440. Multiple memory blocks may be grouped together as a super block for certain functional purposes.

The ECC module 406 may include a decoder 406A, e.g., a bit-flipping (BF) decoder. The ECC module 406 including its decoder 406A may be used to carry out aspects of the present invention. Additional/alternative components that may be utilized with memory systems to effectuate the present invention will be understood to those of skill in the art in light of this disclosure.

A BF decoder has been proposed for GLDPC codes that is based on syndrome decoding. Such decoder can provide high throughput for GLDPC codes with lower system-on-chip (SoC) area. However, in such arrangement the same threshold is applied for each bit in the GLDPC codeword. Naturally, this means that the threshold is not changed based on number of errors present at each iteration. However, the protection for each bit is not fixed for GLDPC construction, so it is not judicious to apply same threshold for all bit flipping.

Embodiments of the present invention are directed to addressing this issue. To that end, embodiments of the present invention provide a decoding scheme that uses an adaptive threshold and a reliability indicator for each bit that is based on its degree and unsatisfied check (USC) information. Such scheme improves the correction capability of the decoder.

More particularly, in embodiments of the present invention, a BF decoder, e.g., BF decoder 135 or 406A, maintains a single bit indicative of the flipping decision for each bit in the GLDPC codeword, and iteratively updates this decision by comparing the syndrome-decoding of component codewords with an adaptive threshold. The adaptive threshold for each bit varies based on the degree of the bit and USC information. Furthermore, the channel mismatch term in the reliability computation function is also biased based on the degree of the bit.

In describing embodiments of the present invention, the following notations are used.

Let m denote the number of component codewords in the GLDPC codeword.

Let n be the number of code-bits in the GLDPC codeword.

Let M[k] denote the set of component codewords to which the kth code-bit belongs.

Let $\bar{s}_j$ denote the syndrome corresponding to the jth check node.

Let $L_j$ denote the jth syndrome-decoding table, i.e., given the syndrome of the jth component codeword $\bar{s}$, $L[\bar{s}]$ are the code-bits that must be flipped to decode that component codeword.

Let S denote the jth syndrome-encoding table, i.e., given code-bit k, the corresponding syndrome of the component codeword is S[k].

Let $l_{max}$ be the maximum number of iterations.

Let $\bar{y} \in \{0, 1\}^n$ be the channel output that may have errors.

Let $\bar{x} \in \{0, 1\}^n$ be the decision-bits for all code-bits.

Let [t] denote the set $\{1, 2, \ldots, t\}$ for any natural number t.

Let $d_k$ be the degree of the kth code-bit.

Let $\alpha(d_k)$ denote the bias term for the channel mismatch information for the kth code-bit.

The syndromes of all component codewords are initialized based on the received GLDPC codeword from the memory device 200, e.g., NAND flash memory. Decoding is performed until the maximum number of iterations is reached, which may be set based on system configuration and/or operation considerations. At each iteration of decoding, every code-bit flipping decision is made independently.

A reliability indicator is computed based on whether the current, e.g., hard, decision for a given code-bit matches the decision from the channel, and whether the decoding of the component codeword results in an error on that code-bit. The degree of the code-bit is used in predicting reliability. In particular, the channel mismatch information is biased based on bit degree. In an embodiment, the channel mismatch information is biased using a biasing coefficient ($\alpha(d_k)$). The biasing improves the estimation of the reliability indicator.

The reliability indicator is compared to an adaptive threshold. If the reliability indicator is determined to be below the adaptive threshold, the decision-bit is flipped and the syndromes of the corresponding component codewords are updated. The flipping decision for each bit depends on the degree of the bit ($d_k$) and USC information. As the number of errors are reduced, the adaptive threshold is changed based on the USC information. A heuristic table on a function, the inputs of which are bit degree and USC information, e.g., $\theta(d_k, USC)$, can be constructed based on $d_k$ and USC information to improve correction capability.

The decoding iterations continue until all component codewords are decoded, i.e., their respective syndromes are zero, or until the maximum number of iterations is completed. In the latter case, decoding failure is declared.

Figure 5:
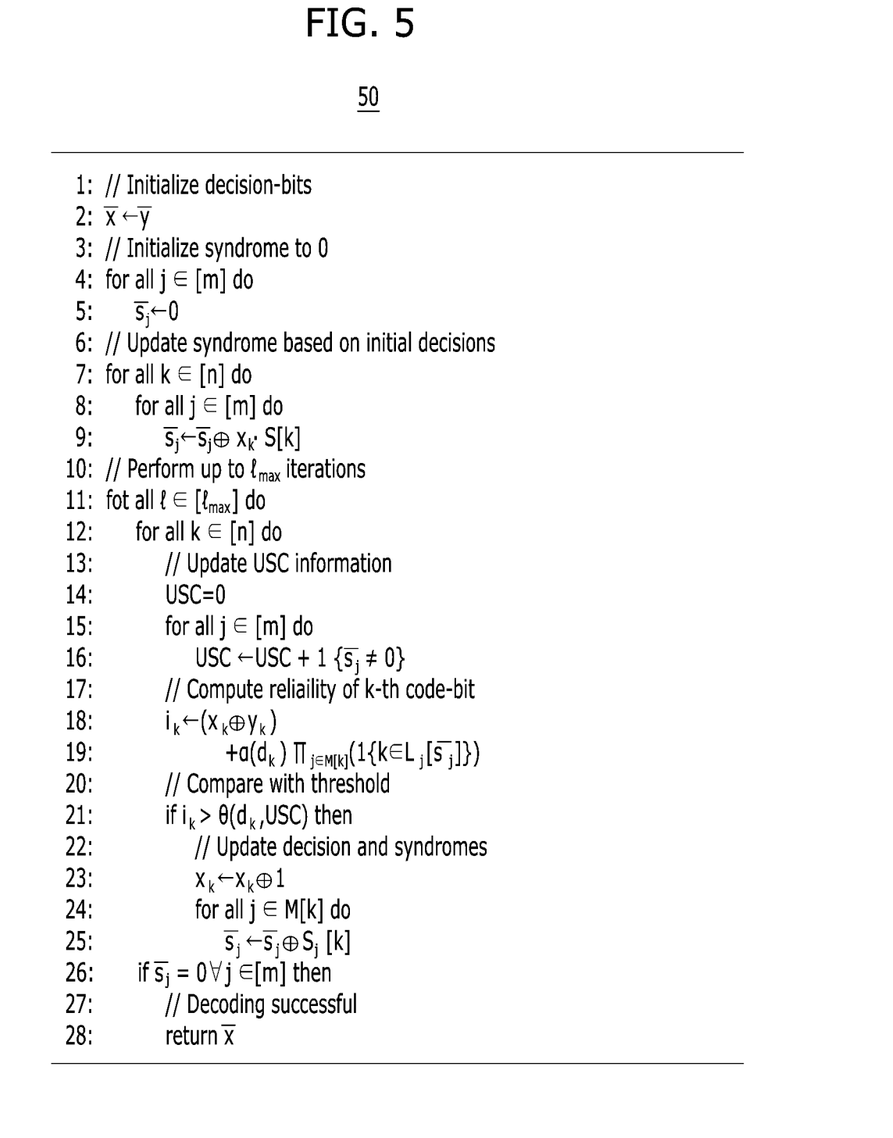
FIG. 5 shows exemplary pseudocode for decoding GLDPC codes with a bit-flipping (BF) decoder in accordance with an embodiment of the present invention.

The decoding scheme in accordance with embodiments is illustrated in pseudocode 50 shown in FIG. 5. The decoding may be performed by the BF decoder 135 or 406A within the ECC component 130 or ECC module 406 respectively, and may operate in conjunction with other components of the memory controller 100. The BF decoder 135/406A may be implemented with appropriate hardware, software, firmware or combination thereof.

Referring to FIG. 5, in conjunction with other figures, the BF decoder 135/406A for decoding GLDPC codes computes reliability by biasing channel mismatch information and uses an adaptive threshold based on $d_k$ and USC information to improve the correction capability of the BF decoder 135/406A.

The decision bits are initialized. The syndromes for the corresponding check nodes are initialized to 0, and subsequently updated based on initial decisions. In one or more iterations up to a maximum number of iterations, USC information is updated, the reliability of the kth code-bit is computed based on the current initial, e.g., hard, decision and the current channel information, e.g., channel mismatch information, the reliability is compared with the threshold, and the decision and syndromes are updated based on the comparison. Decoding iterations continue until the syndromes of all component codewords are determined to be 0.

Figure 6:
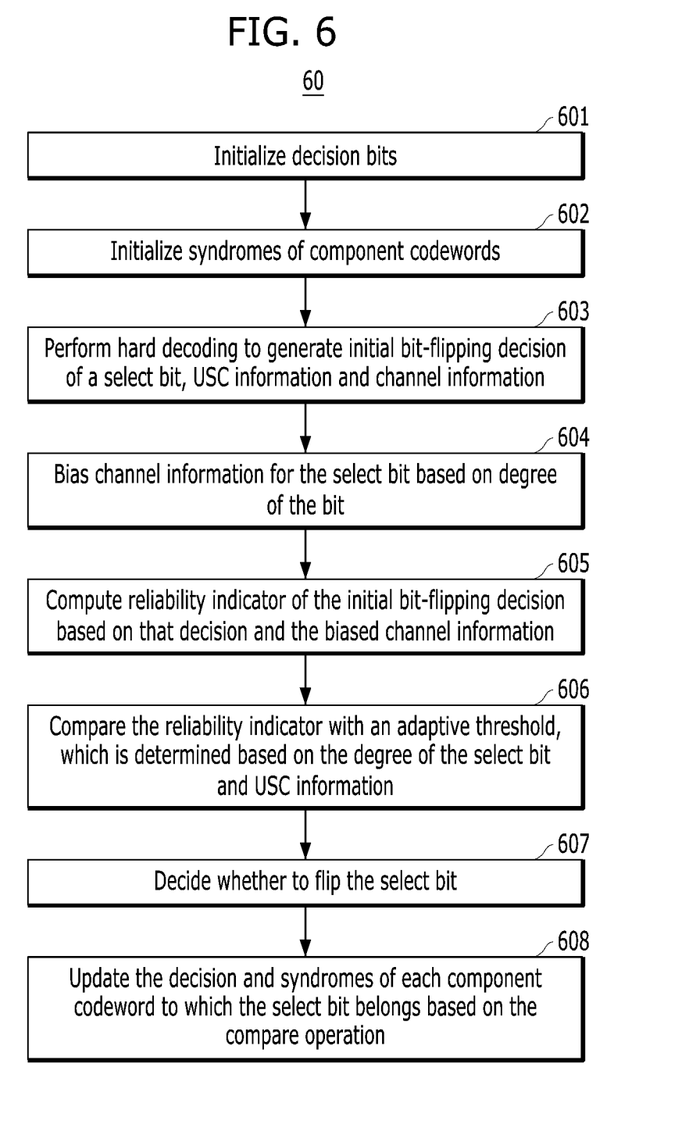
FIG. 6 is a flow chart illustrating steps in processes for decoding with adaptive thresholding in accordance with embodiments of the present invention.

FIG. 6 is a flow chart describing steps in processes for decoding GLDPC codes, in accordance with embodiments of the present invention. The steps shown in flow chart 60 are exemplary. Those skilled in the art will understand that additional and/or alternative steps may be performed, or that the order of steps may be changed, to effectuate aspects of the present invention without departing from the inventive concepts disclosed herein.

At step 601, decision bits are initialized. Syndromes of component codewords are initialized at step 602. Hard decoding is performed at step 603 to generate an initial decision as to whether to flip a select bit, USC information and channel information. The select bit belongs in each of the component codewords initialized at step 602.

The degree of the select bit is used to determine a biasing coefficient that is applied to the channel information at step 604. The biased channel information is then used along with the initial bit-flipping decision in step 605 to compute a reliability indicator of that initial decision. At step 606, the reliability indicator is compared with an adaptive threshold, which is determined based on the degree of the select bit and USC information. A decision is made as to whether to flip the select bit at step 607.

At step 608, the decision and syndromes of each of the component codewords are updated based on the compare operation. Decoding iterations continue until the syndromes of all component codewords are zero, which indicates that such codewords have been successfully decoded, or until a maximum number of iterations is reached, at which point decoding failure is declared.

As the foregoing demonstrates, embodiments of the present invention provide techniques for bit-flipping decoding of GLDPC codes with adaptive thresholding and using biasing channel mismatch information. Such techniques advantageously provide significant gains in memory system performance.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
a decoder configured to perform decoding of a codeword comprising a plurality of bits, wherein for a select one of the plurality of bits, which belongs to at least one component codeword of the codeword, at an iteration of decoding, the decoder is configured to:
perform an initial decision for the select bit;
initialize syndromes of each component codeword;
generate initial bit-flipping decision for the select bit, unsatisfied check (USC) information, and channel information by hard decoding;
bias the channel information of the select bit based on a degree of the select bit;
compute a reliability indicator of an initial decision, represented by at least one bit, as to whether to flip the select bit based on the initial decision and the biased channel information;
compare the reliability indicator with an adaptive threshold, which is determined based on the degree of the select bit and the unsatisfied check (USC) information from the initial decision;
decide whether to flip the select bit based on the compare operation; and
update the initial decision and syndromes of each component codeword to which the select bit belongs based on the compare operation.

2. The memory controller of claim 1, wherein the syndromes of the respective component codewords to which the select bit belongs are initialized before performing a first iteration.

3. The memory controller of claim 1, wherein the decoder applies a biasing coefficient to bias the channel information.

4. The memory controller of claim 1, wherein the decoder maintains a single bit representing a current decision for the select bit.

5. The memory controller of claim 1, further comprising: determining whether the syndromes of the respective component codewords to which the select bit belongs are zero.

6. The memory controller of claim 5, wherein, when it is determined that not all of the syndromes of the respective codewords are zero, the decoder performs another iteration of decoding.

7. The memory controller of claim 1, wherein the other of the plurality of bits are processed, each of the other of the plurality of bits becoming the select bit during its processing.

8. The memory controller of claim 7, wherein the decision as to whether to flip the select bit is made independently of decisions to flip the other of the plurality of bits.

9. The memory controller of claim 8, wherein the adaptive threshold varies for each bit processed in a decoding iteration based on the degree of the bit and the USC information.

10. The memory controller of claim 1, wherein the decoder performs decoding of all of the component codewords.

11. A method of decoding a codeword comprising a plurality of bits, wherein for a select one of the plurality of bits, which belongs to at least one component codeword of the codeword, the method comprising:
performing an initial decision for the select bit;
initialize syndromes of each component codeword;
generate initial bit-flipping decision for the select bit, unsatisfied check (USC) information, and channel information by hard decoding;
bias the channel information of the select bit based on the degree of the select bit;
computing a reliability indicator of an initial decision, represented by at least one bit, as to whether to flip the select bit based on the initial decision and the biased channel information;
comparing the reliability indicator with an adaptive threshold, which is determined based on the degree of the select bit and the unsatisfied check (USC) information from the initial decision;
deciding whether to flip the select bit based on the comparing operation; and
updating the initial decision and syndromes of each component codeword to which the select bit belongs based on the comparing operation.

12. The method of claim 11, further comprising initializing the syndromes of the respective component codewords to which the select bit belongs before performing a first iteration.

13. The method of claim 11, wherein the decoder applies a biasing coefficient to bias the channel information.

14. The method of claim 11, wherein the decoder maintains a single bit representing a current decision for the select bit.

15. The method of claim 11, further comprising:
determining whether the syndromes of the respective component codewords to which the select bit belongs are zero.

16. The method of claim 15, wherein, when it is determined that not all of the syndromes of the respective codewords are zero, the decoder performs another iteration of decoding.

17. The method of claim 11, wherein each of the plurality of bits is processed in turn as the select bit.

18. The method of claim 17, wherein the decision as to whether to flip the select bit is made independently of decisions to flip the other of the plurality of bits.

19. The method of claim 18, wherein the adaptive threshold varies for each of the plurality of bits based on the degree of the bit and the USC information.

20. The method of claim 11, wherein the decoding is performed for all of the component codewords.

* * * * *